(12) United States Patent
Kadoi

(10) Patent No.: US 7,750,443 B2
(45) Date of Patent: Jul. 6, 2010

(54) SEMICONDUCTOR DEVICE PACKAGE

(75) Inventor: Kiyoaki Kadoi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/178,341

(22) Filed: Jul. 23, 2008

(65) Prior Publication Data
US 2009/0026595 A1 Jan. 29, 2009

(30) Foreign Application Priority Data
Jul. 27, 2007 (JP) ............................. 2007-195494

(51) Int. Cl.
*H01L 23/495* (2006.01)
(52) U.S. Cl. ................. 257/666; 257/667; 257/669; 257/672; 257/784; 257/E33.066; 257/E23.031; 257/E23.523; 438/112; 438/124; 438/126; 438/127
(58) Field of Classification Search ................. 257/112, 257/126, 666, 667, 672, 789, 787, 788, 790–795, 257/E21.499, E21.523; 438/112, 124, 126, 438/127
See application file for complete search history.

(56) References Cited

U.S. PATENT DOCUMENTS

| | | | |
|---|---|---|---|
| 6,197,615 B1 * | 3/2001 | Song et al. .................. | 438/111 |
| 2004/0094829 A1 * | 5/2004 | Minamio et al. ............ | 257/676 |
| 2006/0027900 A1 * | 2/2006 | Takeuchi et al. ............ | 257/675 |

FOREIGN PATENT DOCUMENTS

JP 8-167686 A 6/1996

* cited by examiner

*Primary Examiner*—Lynne A Gurley
*Assistant Examiner*—Yosef Gebreyesus
(74) *Attorney, Agent, or Firm*—Brinks Hofer Gilson & Lione

(57) ABSTRACT

A surface of a lead frame of a semiconductor device package, on which a semiconductor chip is mounted, is formed to have a mesh structure, whereby a connecting area between the lead frame and a molding resin can be increased to have strong bonding. Further, only filler particles having a small diameter than the mesh are taken into the vicinity of the lead frame, suppressing the effect of stresses to reduce deformation of the lead frame.

5 Claims, 4 Drawing Sheets

SEMICONDUCTOR DEVICE PACKAGE

RELATED APPLICATIONS

This application claims priority under 35 U.S.C. §119 to Japanese Patent Application No. JP2007-195494 filed on Jul. 27, 2007, the entire content of which is hereby incorporated by reference.

BACKGROUND OF THE INVENTION

The present invention relates to a semiconductor device package.

A semiconductor device package in which a microelectronic device such as a semiconductor chip is electrically connected to a lead frame and molded with resin is widely used. FIG. 6 shows a structure of a typical semiconductor device package in which a semiconductor chip 101 is disposed on a central die pad portion 107 which is a part of a lead frame 102, and is bonded thereto with an adhesive resin layer. The semiconductor chip 101 is electrically connected to the lead frame 102 through bonding wires 103. A resin package body 104 made of epoxy resin and filler is formed to cover the semiconductor chip 101 and the lead frame 102, sealing the semiconductor chip 101 and the lead frame 102 in the resin package body 104. A part of the lead frame 102 is extended to the outside of the resin package body 104 to serve as an external lead 105, which is used as a connecting terminal with an external circuit.

One of the problems inherent in this type of semiconductor device package is that water infiltrates into the interior thereof along an interface between the resin and the lead frame, resulting in adverse effects such as a decrease in electrical insulation. As shown in FIG. 7, water infiltrates through an interface 106 between the external lead 105 and the resin package body 104. The infiltrated water penetrates into the resin package body 104 along the lead frame 102. Due to the action of the water, separation occurs at the interface between the resin package body 104 and the lead frame 102. As a result, ionic or other types of corrosive contaminants which are present outside the resin package body 104 infiltrate the resin package body 104. The infiltration of water and contaminants induces a short-time failure in the semiconductor chip due to corrosion of a pad.

As described above, infiltration of water at the interface between the resin and the lead frame causes separation of the resin from the lead frame. One factor of the separation is disability of the resin to follow the deformation of the lead frame caused by stresses applied from the environment for use since the filler (silica) included in the resin increases elastic modulus of the resin. FIG. 8 is a schematic cross-sectional view showing distribution of fillers in the vicinity of the lead frame according to the conventional art. A substantially uniform distribution is made by the fillers.

In addition to the problem of insufficient sealing between the lead frame 102 and the resin package body 104, there is another problem of insufficient adhesion at an interface between the back surface of the central die pad portion 107 of the lead frame 102 and the resin package body 104. Presence of such insufficient adhesion urges water to collect at the separated portion 108 generated between the lead frame 102 and the resin package body 104, in particular, during exposure of an electronic device package to a humid environment. The water becomes steam and expands, causing package cracks at a high temperature treatment of the electronic device package in the manufacturing process such as board mounting.

In order to increase an adhesive force of the resin package body to the lead frame to improve the quality and reliability of the resin package products, it is proposed that a surface of the lead frame should be subjected to various types of treatments. A generally known technology for these types of treatments includes subjecting a surface of the lead frame made of copper to a plasma treatment as described in JP 08-167686 A. The conventional plasma cleaning method is generally performed after assembling the semiconductor chip 101, the lead frame 102, and the like, and before the formation process of the resin package body 104.

Though the conventional plasma cleaning method is effective for an upward exposed surface, the method is, however, less effective in increasing an adhesive force between the back surface of the central die pad portion 107 and the resin package body 104. In addition, the method has little effects in increasing the adhesive force between the adhesive resin layer and the lead frame. Moreover, the plasma treatment needs to be performed as a batch treatment, which is uneconomical, and thus the plasma treatment is hard to be applied to assembly process of the resin package production which is continuously performed.

On the other hand, the method of forming on a surface of the lead frame 102 a surface treatment layer made of a black oxide, a brown oxide, a tin oxide and organic silane, or the like is extremely effective for the treatment of inside of the package, but the method causes a number of problems in the treatment of outside of the package. For instance, in the resin forming process, a low-molecular weight portion of a molding resin may flow out to the surface of the lead frame 102. This is a so-called "resin bleed", which electrically insulates the surface of the external lead. Accordingly, in order to connect the package to the printed circuit board or the like, the resin bleed is generally removed before tin-plating or solder-plating of the surface of the external lead. The resin bleed itself can be removed by a generally employed chemical or mechanical method. However, when the resin bleed occurs on the surface of the surface treatment layer made of the black oxide or the like, a tremendously adhesive film is formed due to the interaction between them, which cannot be easily removed. Complete removal of the resin bleed of the surface treatment layer without damaging the lead frame and the package is extremely difficult.

SUMMARY OF THE INVENTION

A semiconductor device package according to the present invention has a mesh structure in a part of a connecting surface between a lead frame and a resin package body, whereby a connecting area of the connecting surface is increased to enhance a connection between the lead frame and the resin package body. Besides, the three-dimensional mesh structure makes the connecting surface between the lead frame and a resin also three-dimensional to extraordinarily improve the adhesion property there between.

In addition, the mesh size of the mesh structure is made smaller than an average diameter of filler particles contained in the resin, whereby reducing the number of fillers reaching to the vicinity of a surface of the lead frame. Accordingly, change of an elastic modulus of the resin in the vicinity of the lead frame permits the resin to follow the lead frame deformation by stress from the environment for use of the semiconductor device package, thereby improving adhesion.

By forming the semiconductor device package with the mesh structure according to the present invention, connecting property between the lead frame to which a semiconductor chip is mounted, and the resin package body can be considerably increased. Moreover, distribution of the fillers contained in the resin can be changed in the vicinity of the lead frame, improving reliability of adhesion between the resin and the connecting surface of the lead frame. Accordingly, separation is less likely to occur in the connecting surface between the lead frame and the resin package body, and infiltration of water and contaminants as well as various associated problems are prevented, whereby improving the quality of the electronic device package.

DETAILED DESCRIPTION OF THE PREFERRED EMBODIMENTS

Hereinafter, embodiments of the present invention are described with reference to drawings.

Figure 1:
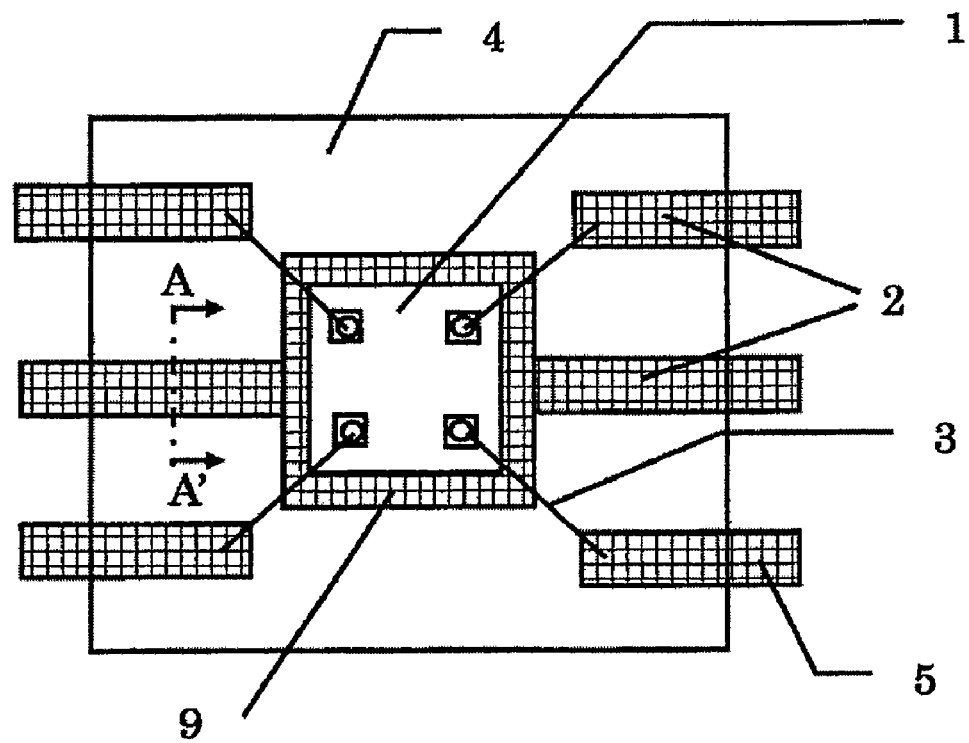
FIG. 1 shows a semiconductor device package according to embodiments of the present invention.

FIG. 1 shows a first embodiment of the present invention. In a semiconductor device package 4, a semiconductor chip 1 is disposed on a die pad 9 which is located in a center of a lead frame 2 made of a copper material, and is bonded to the die pad 9 through an adhesive resin layer. The semiconductor chip 1 is electrically connected to the lead frame 2 through a bonding wire 3. The resin package body 4 which covers the semiconductor chip 1 and the lead frame 2 and is made of an epoxy resin is formed, and the semiconductor chip 1 and the lead frame 2 are sealed in the resin package body 4 thus formed. A part of the lead frame 2 is extended outside the resin package body 4 to serve as an external lead 5, which is used in connection with an external circuit. The point is that the lead frame 2 used in this case has a mesh structure. The mesh structure may exist only on a surface portion of the lead frame 2 and may exist only on the internal part of the lead frame 2.

As a resin material forming the resin package body 4, a novolac epoxy resin can be used. In addition to the novolac epoxy resin, a resin material generally used in the electronic IC package industry, such as epoxy silicon, is used. Other resin such as a polyester resin and a silicon resin is also used.

The lead frame 2 has the die pad 9 of a rectangular plate-like shape which bonds the semiconductor chip 1 in a center thereof. The die pad 9 is connected to a lead frame rail by an arm.

Figure 2:
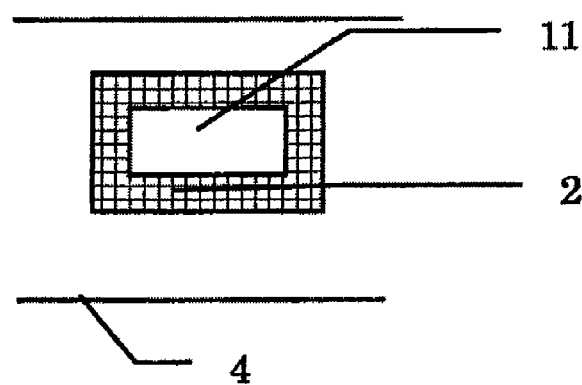
FIG. 2 is a cross-sectional view taken along the line A-A' of FIG. 1.

FIG. 2 is a schematic cross-sectional view of a lead frame portion taken along the line A-A' of FIG. 1. Since the lead frame 2 has a mesh structure 11 on a surface thereof, a connecting surface between the resin and the lead frame 2 structurally has a strong adhesiveness after sealing with a resin, and separation is less likely to occur in the connecting surface between the resin and the lead frame 2.

Figure 3:
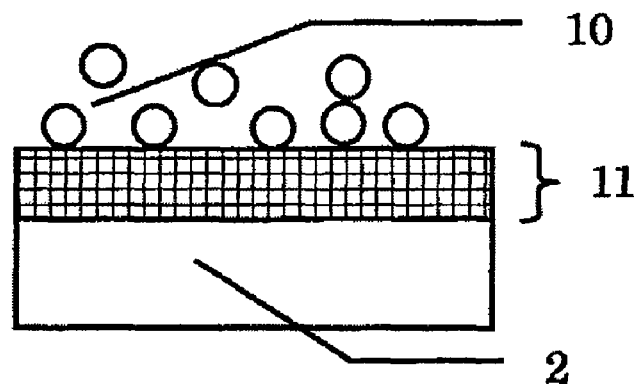
FIG. 3 is a schematic cross-sectional view showing a state of fillers in the vicinity of a lead frame according to the present invention.

FIG. 3 shows a second embodiment of the present invention. The mesh structure of the present invention has a mesh size smaller than an average diameter of filler particles 10 contained in a mold resin. When the mesh size is smaller than the average diameter of the fillers 10 contained in the mold resin to be used, a filler particle having a diameter larger than the average diameter cannot penetrate the mesh structure. Accordingly, an amount and diameter of the fillers contained in the mold resin can be changed in the vicinity of the surface of the lead frame 2, and thus an elastic modulus of the mold resin around the lead frame of the mesh structure 11 can be decreased. Consequently, the mold resin follows the deformation of the lead frame due to an external force, whereby separation is less likely to occur in the connecting surface between the mold resin and the lead frame.

Figure 4:
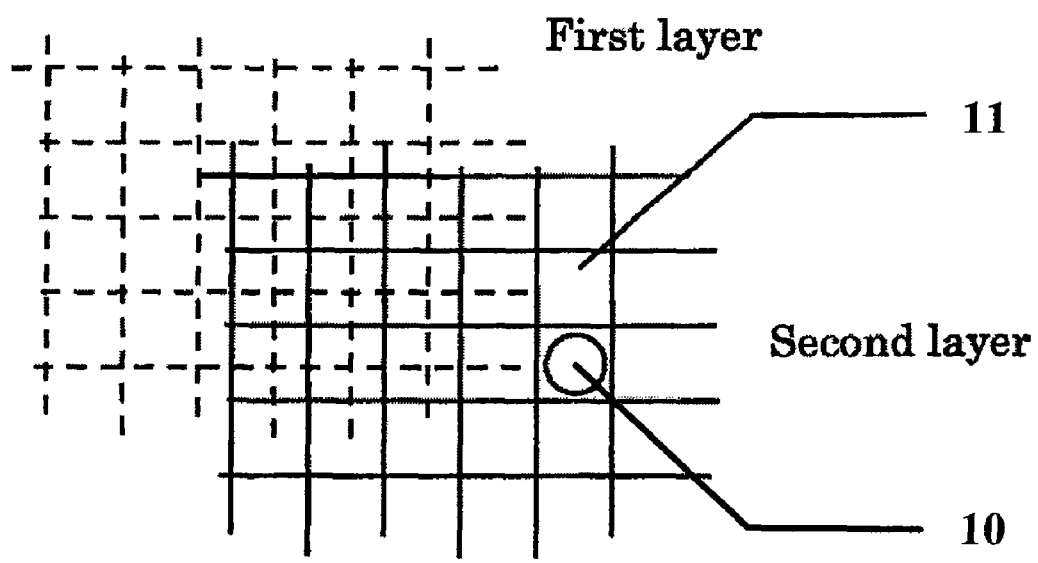
FIG. 4 is a view for explaining how the lead frames according to the present invention are superimposed on each other.

FIG. 4 shows a third embodiment of the present invention, which has a structure in which two or more layers of the mesh structure of the lead frame are piled. With this structure, even when the mesh of each layer has a size larger than the average diameter of the filler particles 10, the resultant mesh size completed by piling the mesh structures becomes smaller, and thus a size of the mesh can be designed with respect to an arbitrary particle diameter. Moreover, when the mesh structure is piled to form a multilayer including more than two layers, the resin penetrates into the lead frame and is structurally bonded thereto more firmly. Accordingly, separation is less likely to occur in the connecting surface between the mold resin and the lead frame.

Figure 5:
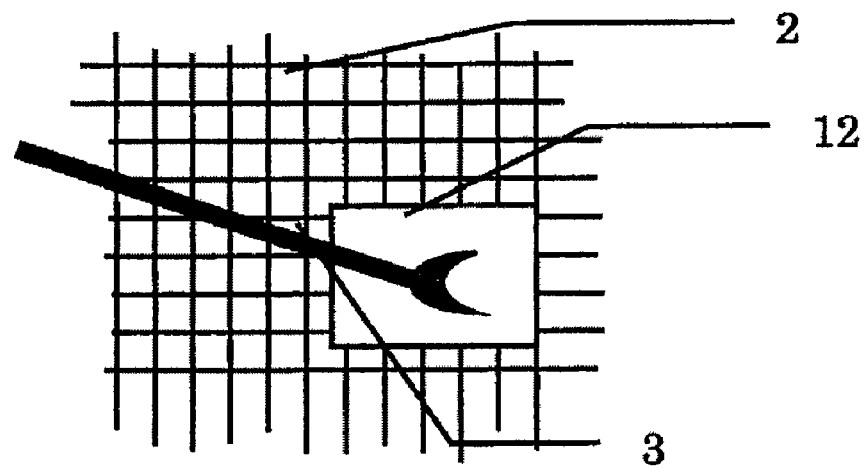
FIG. 5 is a diagram showing a lead frame according to another embodiment of the present invention.
Figure 6:
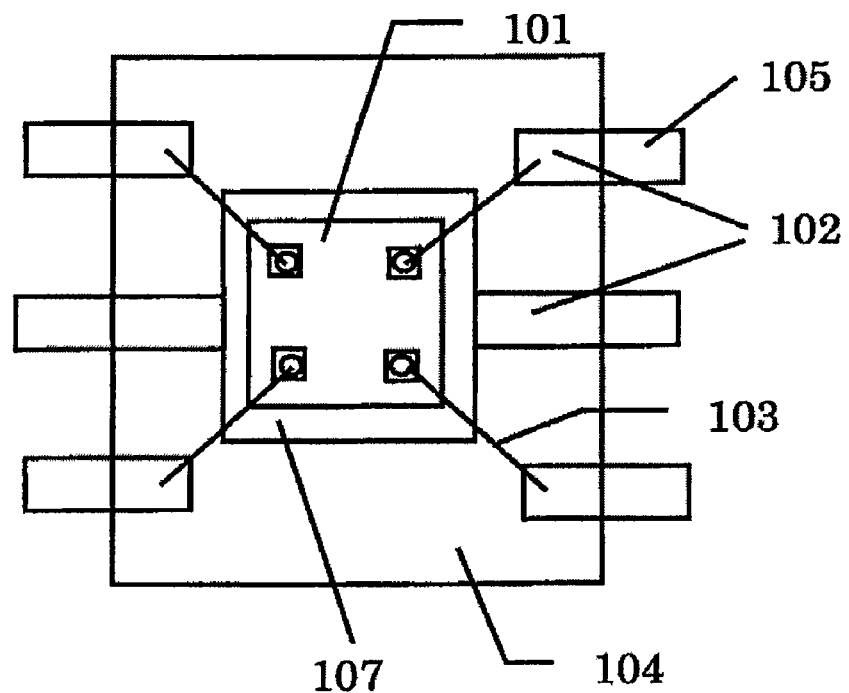
FIG. 6 shows a semiconductor device package according to a conventional art.
Figure 7:
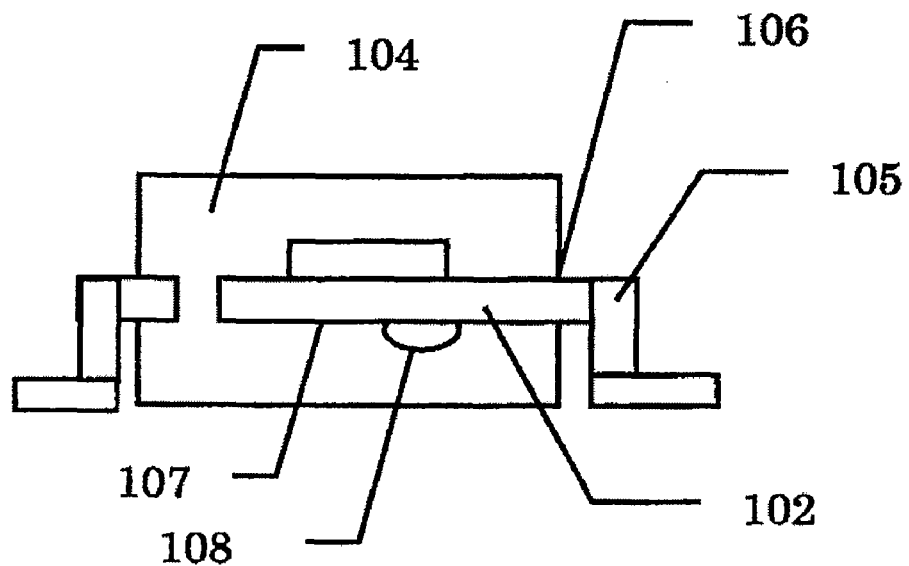
FIG. 7 is a cross-sectional view of the semiconductor device package according to the conventional art.
Figure 8:
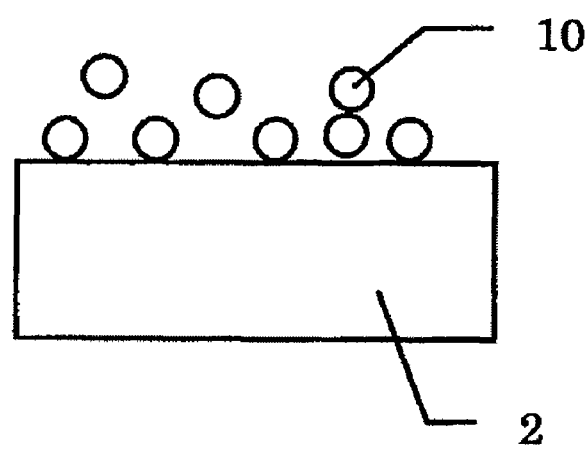
FIG. 8 is a schematic cross-sectional view showing a state of fillers in the vicinity of a lead frame according to the conventional art.

FIG. 5 shows a fourth embodiment of the present invention. The lead frame is electrically connected to the semiconductor chip through wire-bonding. In particular, wedge bonding is performed so that the wire is pressed into a connection part of a lead frame side. Accordingly, if there is a protrusion or a dent on those bonding portions due to the mesh structure, connection strength of the wire bonding may reduce. A portion 12 of the lead frame 2 to which wire-bonding is made, is made flat without formed into the mesh structure, whereby the connection strength of the bonding wire 3 is maintained.

What is claimed is:

1. A semiconductor device, comprising:
   a semiconductor chip;
   a lead frame having a die pad portion on which the semiconductor chip is disposed, electrically connected to the semiconductor chip through a bonding wire, at least a portion of the lead frame comprising a mesh structure; and
   a resin package sealing the semiconductor chip and a part of the lead frame and comprising a plurality of filler particles contained in a mold resin;
   wherein the lead frame contacts the resin package through the mesh structure and a mesh size of the mesh structure is determined with respect to at least one diameter of the plurality of filler particles, thereby preventing the plurality of filler particles from penetrating the mesh structure.

2. A semiconductor device according to claim 1, wherein the mesh structure is disposed only on a surface portion of the lead frame.

3. A semiconductor device according to claim 1, wherein the mesh size of the mesh structure is smaller than the at least one diameter of the plurality of filler particles contained in the mold resin.

4. A semiconductor device package according to claim 1, wherein the mesh structure of the lead frame comprises at least two mesh layers that are piled.

5. A semiconductor device according to claim 1, wherein a connection part of the lead frame to which wire-bonding is made comprises no mesh structure.

* * * * *